United States Patent
Azumi et al.

[11] Patent Number: 5,415,945
[45] Date of Patent: * May 16, 1995

[54] DIELECTRIC CERAMIC COMPOSITION FOR LOW TEMPERATURE SINTERING

[75] Inventors: Takeshi Azumi; Yasunobu Yoneda; Hiroshi Morii, all of Nagaokakyo, Japan

[73] Assignee: Murata Manufacturing Co., Ltd., Kyoto, Japan

[*] Notice: The portion of the term of this patent subsequent to Feb. 5, 2008 has been disclaimed.

[21] Appl. No.: 890,390

[22] Filed: May 26, 1992

Related U.S. Application Data

[62] Division of Ser. No. 716,820, Jun. 17, 1991, abandoned.

[30] Foreign Application Priority Data

Jun. 19, 1990 [JP] Japan .................................. 2-161764

[51] Int. Cl.$^6$ .................................................. B32B 9/00
[52] U.S. Cl. .................................. 428/692; 29/25.41; 264/61; 428/652; 501/134
[58] Field of Search ............... 501/126, 134, 135, 136; 428/692, 652; 29/25.41, 25.42, 602.1, 608; 156/89; 264/60, 61, 239, 240, 241, 299, 319, 332

[56] References Cited

U.S. PATENT DOCUMENTS

| | | | |
|---|---|---|---|
| 4,379,319 | 4/1983 | Killson | 501/134 X |
| 4,601,988 | 7/1986 | Sakabe et al. | 501/134 |
| 4,661,462 | 4/1987 | Sakabe et al. | 521/134 |
| 4,818,736 | 4/1989 | Yamashita et al. | 501/134 X |
| 4,990,202 | 2/1991 | Murata et al. | 29/25.41 |

Primary Examiner—Paul J. Thibodeau
Assistant Examiner—R. Follett
Attorney, Agent, or Firm—Ostrolenk, Faber, Gerb & Soffen

[57] ABSTRACT

A dielectric ceramic composition for low temperature sintering according to the invention is a composition which is a solid solution having two components of $Pb(Ni_{\frac{1}{3}}Nb_{\frac{2}{3}})O_3$—$PbTiO_3$ and at least one additive component of $Pb(Zn_{\frac{1}{2}}W_{\frac{1}{2}})O_3$ and $Pb(Cu_{\frac{1}{3}}Nb_{\frac{2}{3}})O_3$, and the mol percents of the components fall within the following ranges: $Pb(Ni_{\frac{1}{3}}Nb_{\frac{2}{3}})O_3$ 75.0–85.0; $PbTiO_3$ 0–15.0; at least one of $Pb(Zn_{\frac{1}{2}}W_{\frac{1}{2}})O_3$ and $Pb(Cu_{\frac{1}{3}}Nb_{\frac{2}{3}})O_3$ 5.0–16.5. Further, at least one of oxides of Mn, Mg, and Ca below 0.5 mol percent may be added to the above composite.

10 Claims, 3 Drawing Sheets

F I G. 4
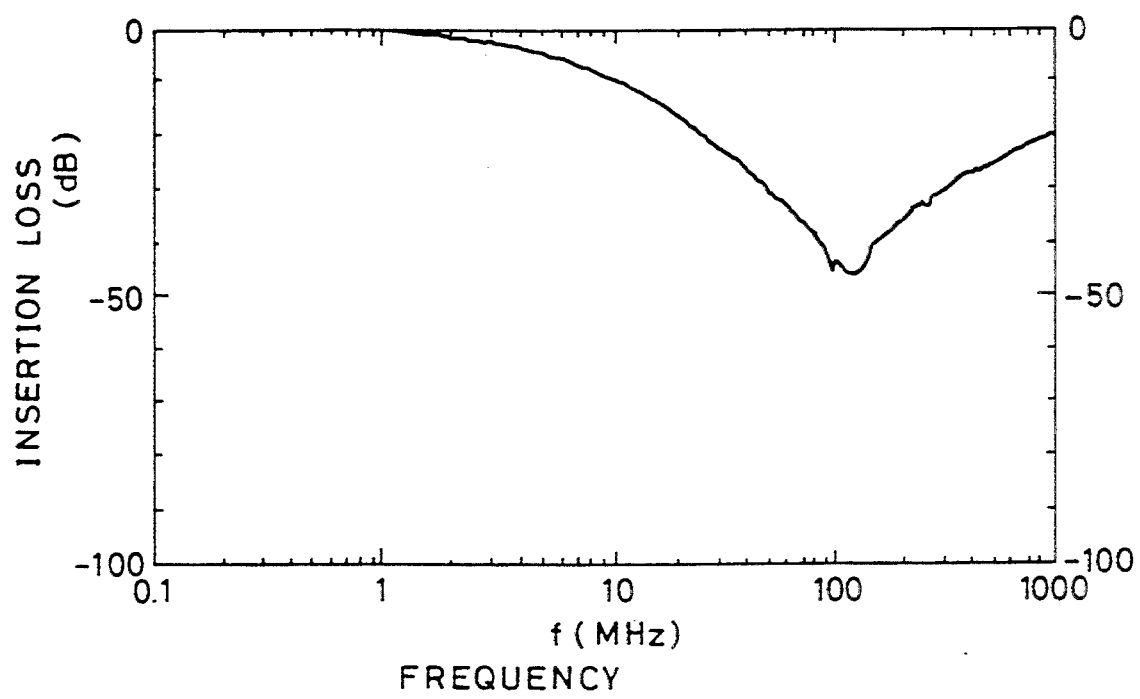

DIELECTRIC CERAMIC COMPOSITION FOR LOW TEMPERATURE SINTERING

This is a division of application Ser. No. 07/716,820 filed on Jun. 17, 1991, now abandoned.

BACKGROUND OF THE INVENTION

1. Field of the Invention

This invention relates to a dielectric ceramic composition for low temperature sintering and, more particularly, to a dielectric ceramic composition for low temperature sintering for use as the ceramic material of a capacitor in an LC composite chip element.

2. Description of the Prior Art

Up to now, an LC composite element is comprised of an inductor and a capacitor which were separately manufactured, and widely used as a filter for example. However, it is difficult for the conventional LC composite element to cope with miniaturization of electronic parts, and manufacturing the LC composite elements as one-chip parts requires complicated processes and increases the manufacturing cost.

Therefore, there is an idea that LC components are formed by integrally molding and firing an inductance material and a capacitance material. In order to manufacture the part of the capacitor of such an LC composite element, a dielectric ceramic composition for low temperature sintering which is capable of being fired at a temperature below 1000° C. and using a low cost material for internal electrodes has been required.

Until now, there have been some dielectric ceramic materials for low temperature sintering such as a $BaTiO_3$ material including glass components of oxides of boron, bismuth and lead, and a Pb system complex perovskite material. Further, as a dielectric material for the LC composite chip element of the co-firing type, there have been a $TiO_2$—$CuO$—$MnO$ series material disclosed in Japanese Patent Publication No. 57042/1987 and a $TiO_2$—$CuO$—$NiO$—$MnO$ series material disclosed in Japanese Patent Provisional Publication No. 106120/1985.

The $BaTiO_3$ material including glass components is not capable of being sintered at a low temperature below 1000° C. while keeping the $BaTiO_3$'s property unchanged.

The Pb system complex perovskite material is capable of being sintered at a low temperature below 1000° C. and has a large dielectric constant of 10000–20000. Such a material has been disclosed in, for example, Japanese Patent Provisional Publication No. 128408/1986 and No. 128409/1986 and has a too large dielectric constant. Therefore, in order to obtain a capacity of 0.1–10 nF, it is required to enlarge the spacing between the internal electrodes or to reduce the area of the internal electrode. However, the enlargement of the spacing between the internal electrodes disables the parts from their miniaturization and the reduction of the internal electrode area causes difficulty in keeping capacity accuracy in view of parts manufacturing. Further, the linear shrinkage curve of the magnetic substance and that of the dielectric material during firing did not conform each other, and therefore cracks or warps would arise in the material during the co-firing and thus co-firing was a difficult problem to solve.

The $TiO_2$—$CuO$—$MnO$ series material or $TiO_2$—$CuO$—$NiO$—$MnO$ series material is capable of being sintered at a low temperature below 900° C., but these materials have a small dielectric constant and thus could not be used for miniaturization of the part of the capacitor of an LC composite chip element and the range of capacitances obtained was narrow.

SUMMARY OF THE INVENTION

Therefore, it is an object of the invention to provide a dielectric ceramic composition for low temperature sintering which is capable of being co-fired with a magnetic substance at a low temperature below 1000° C. and has a dielectric constant of 1000–4000.

The dielectric ceramic composition for low temperature sintering according to the present invention is a composite which is a solid solution having two main components of $Pb(Ni_{\frac{1}{3}}Nb_{\frac{2}{3}})O_3$—$PbTiO_3$ and at least one additive component of $Pb(Zn_{\frac{1}{2}}W_{\frac{1}{2}})O_3$ and $Pb(Cu_{\frac{1}{3}}Nb_{\frac{2}{3}})O_3$, and the mol percents of the components fall within the following ranges: $Pb(Ni_{\frac{1}{3}}Nb_{\frac{2}{3}})O_3$ 75.0–85.0; $PbTiO_3$ 0–15.0; at least one of $Pb(Zn_{\frac{1}{2}}W_{\frac{1}{2}})O_3$ and $Pb(Cu_{\frac{1}{3}}Nb_{\frac{2}{3}})O_3$ 5.0–16.5.

Further, at least one of oxides of Mn, Mg, and Ca below 0.5 mol percent may be added to the above composite.

The $Pb(Ni, Nb)O_3$ material having a low Curie temperature is added to the $PbTiO_3$ series composite oxide material which is capable of being sintered at a low temperature below 1000° C. and has a large dielectric constant. Thereby the Curie point of the dielectric constant shifts to near −50° C., and a range having a gentle temperature characteristic of the dielectric constant is used within the normal operating temperature range. However, increase in the $Pb(Ni, Nb)O_3$ component causes difficulty in the low temperature sintering at a temperature below 1000° C., thus the $Pb(Cu, Nb)O_3$ and $Pb(Zn, W)O_3$ materials which are verified to be effective to the low temperature sintering are added and quantities of the additives are adjusted to enable the co-firing with the magnetic substance.

In addition, in the co-firing with the magnetic substance, diffusion of Fe and Cu ions and the like from the magnetic substance to the dielectric material arises, and thus decrease in an insulation resistance of the capacitor portion may occur. Then, the insulation resistance is prevented from decrease by adding oxides of Mn, Ca and Mg.

According to the invention, the co-firing with the magnetic substance at a low temperature below 1000° C. is possible and the dielectric material having a dielectric constant of 1000–4000 can be obtained.

The above and other objects, features, aspects and advantages of the invention will more fully be apparent from the following detailed description with accompanying drawings.

BRIEF DESCRIPTION OF THE DRAWINGS

FIG. 4 is a graph showing a frequency characteristic of the LC composite element shown in FIGS. 2A and 2B.

DESCRIPTION OF THE PREFERRED EMBODIMENTS

Embodiment 1

Powders of PbO, NiO, Nb$_2$O$_3$, CuO, ZnO, WO$_3$, TiO$_2$, CaCO$_3$, MgCO$_3$ and MnO$_2$ were first prepared as raw materials. These raw materials were weighed to obtain ceramic compositions in table 1 and mixed by a ball mill to get a mixture of them. This mixture, after being dried, was calcined at 750° C. for two hours and pulverized to obtain pulverized powder. To this pulverized powder, an organic resin binder was added and this powder was molded to get a disk 10 mm in diameter and 1 mm thick. This disk was fired at 900° C. to make a capacitor having external electrodes on both the surface of it.

The dielectric constant, dielectric loss, resistivity and the shrinkage factor after firing were measured and the results are shown in Table 2.

As can be seen from Tables 1 and 2, using the dielectric ceramic composition for low temperature sintering of the invention, capacitors having a dielectric constant of 1000 to 4000 and a small dielectric loss can be obtained.

Embodiment 2

The same dielectric material as Embodiment 1 and a Ni—Zn—Cu ferrite material as a magnetic substance capable of being fired at 900° C. in air were prepared. The dielectric material was mixed with an organic resin binder of 6% by weight and the ferrite material was also mixed with the organic resin binder of 8% by weight to produce slurries. Using these slurries, green sheets were formed by the doctor blade method.

Figure 1:
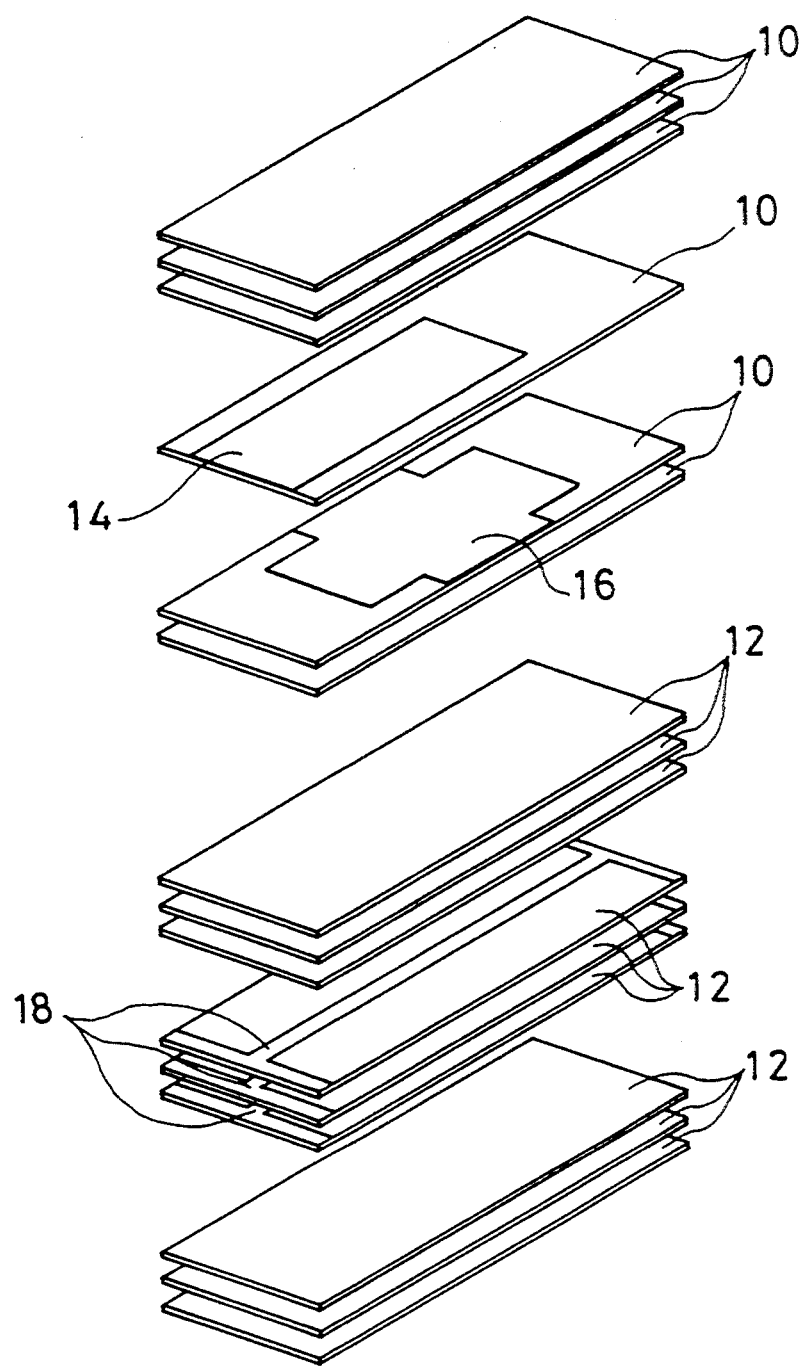
FIG. 1 is an exploded perspective view showing processes of forming an LC composite element by using a dielectric ceramic composition for low temperature sintering of the invention.

Next, paste having a main component of Ag/Pd=9/1 powder was prepared to serve as the capacitor internal electrodes and inductor internal conductors. Then, the paste was printed on dielectric sheets 10 and magnetic substance sheets 12 as shown in FIG. 1. In this case, on one dielectric sheet 10, a first printed layer 14 extending from its longitudinal one end toward the other end, and on the other dielectric sheet 10, a second printed layer 16 connecting both the transversal ends of the sheet 10 at its center were formed. The respective dielectric sheets 10 having each printed layer 14, 16 were sandwiched in between the dielectric sheets 10 having no paste-printed layer.

Further, on the magnetic substance sheet 12, a third printed layer 18 connecting both the longitudinal ends of the sheet 12 was formed. A plurality of the magnetic substance sheets 12 having the third printed layer 18 were prepared, and each of the magnetic substance sheets 12 with the third printed layer 18 was sandwiched in between the magnetic substance sheets 12 having no paste-printed layer.

Figure 2A:
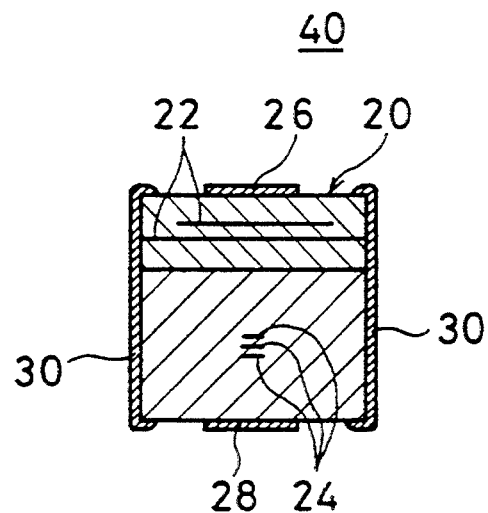
FIG. 2A is a sectional view showing a transversal cut of an LC composite element made of a dielectric ceramic composition for low temperature sintering of the invention.
Figure 2B:
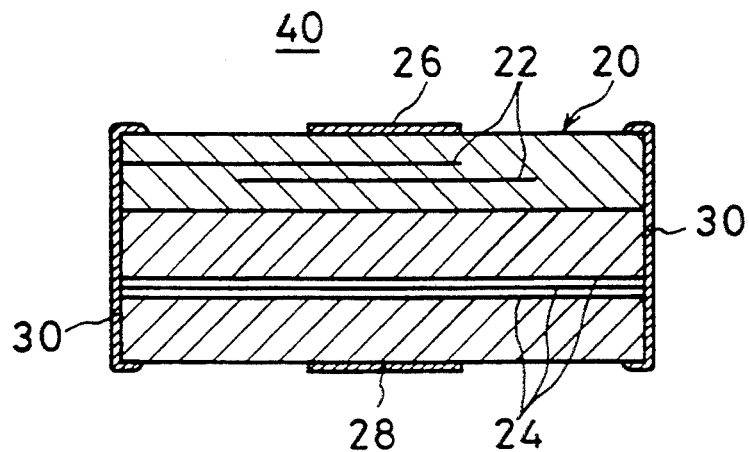
FIG. 2B is a sectional view showing a longitudinal cut of an LC composite element.

These dielectric sheets 10 and magnetic substance sheets 12 were laminated and pressed by pressure of 1.8 t/cm$^2$ and co-fired at 900° C. to obtain a sintered body 20. The capacitor internal electrodes 22 and the inductor internal conductors 24 were formed in the sintered body 20 by co-firing the dielectric sheets 10, magnetic substance sheets 12 and the printed layers 14, 16 and 18 as shown in FIGS. 2A and 2B. Then, external electrodes 26 and 28 were formed on respective principal planes of the sintered body 20, and other external electrodes 30 were formed on side planes of the sintered body 20. Thus, the LC composite element 40 was formed.

Figure 3:
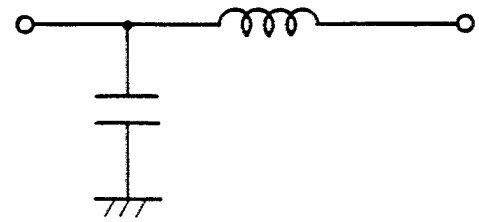
FIG. 3 is an equivalent circuit diagram of the LC composite element shown in FIGS. 2A and 2B.

The equivalent circuit of the LC composite element 40 thus obtained is shown in FIG. 3. The frequency characteristic of the LC composite element 40 was measured and the result of it is shown in FIG. 4.

As can be seen from FIG. 4, this LC composite element 40 has a frequency characteristic usable as a noise filter. In this way, using the dielectric ceramic composition for low temperature sintering according to the invention, an LC composite chip element integrally incorporating capacitors having a small size and a large capacity can be obtained and this facilitates design for a noise filter. In particular, the dielectric sheets and the magnetic substance sheets can be integrated before firing of them, and this enables reducing the manufacturing cost of the composite element.

It will be apparent from the foregoing that, while the present invention has been described in detail and illustrated, these are only particular illustrations and examples and the invention is not limited to these. The spirit and scope of the invention is limited only by the appended claims.

TABLE 1

| SAMPLE No. | COMPOSITION (mol %) | | | |
|---|---|---|---|---|
| | Pb(Ni$_{1/3}$Nb$_{2/3}$)O$_3$ | PbTiO$_3$ | Pb(Zn$_{1/2}$W$_{1/2}$)O$_3$ | Pb(Cu$_{1/3}$Nb$_{2/3}$)O$_3$ |
| 1* | 74.0 | 4.0 | 11.0 | 11.0 |
| 2* | 74.0 | 8.0 | 9.0 | 9.0 |
| 3* | 74.0 | 12.0 | 7.0 | 7.0 |
| 4* | 75.0 | 7.0 | 9.0 | 9.0 |
| 5 | 75.0 | 9.0 | 16.0 | 0 |
| 6 | 75.0 | 9.0 | 8.0 | 8.0 |
| 7 | 75.0 | 9.0 | 0 | 16.0 |
| 8 | 75.0 | 13.0 | 12.0 | 0 |
| 9 | 75.0 | 13.0 | 6.0 | 6.0 |
| 10 | 75.0 | 13.0 | 0 | 12.0 |
| 11 | 75.0 | 15.0 | 10.0 | 0 |
| 12 | 75.0 | 15.0 | 5.0 | 5.0 |
| 13 | 75.0 | 15.0 | 0 | 10.0 |
| 14* | 75.0 | 17.0 | 4.0 | 4.0 |
| 15* | 77.0 | 6.0 | 8.5 | 8.5 |
| 16 | 77.0 | 15.0 | 4.0 | 4.0 |
| 17* | 78.0 | 4.0 | 9.0 | 9.0 |
| 18 | 78.0 | 7.0 | 0 | 15.0 |
| 19 | 78.0 | 13.0 | 9.0 | 0 |
| 20* | 80.0 | 0 | 10.0 | 10.0 |
| 21 | 80.0 | 8.0 | 6.0 | 6.0 |
| 22 | 80.0 | 15.0 | 5.0 | 0 |

TABLE 1-continued

| SAMPLE No. | COMPOSITION (mol %) | | | |
|---|---|---|---|---|
| | $Pb(Ni_{1/3}Nb_{2/3})O_3$ | $PbTiO_3$ | $Pb(Zn_{1/2}W_{1/2})O_3$ | $Pb(Cu_{1/3}Nb_{2/3})O_3$ |
| 23* | 80.0 | 16.0 | 2.0 | 2.0 |
| 24* | 81.0 | 2.0 | 8.5 | 8.5 |
| 25* | 83.0 | 0 | 8.5 | 8.5 |
| 26 | 83.0 | 1.0 | 8.0 | 8.0 |
| 27 | 83.0 | 6.0 | 5.0 | 6.0 |
| 28 | 83.0 | 12.0 | 2.5 | 2.5 |
| 29* | 83.0 | 15.0 | 2.0 | 0 |
| 30 | 83.5 | 0 | 16.5 | 0 |
| 31 | 83.5 | 0 | 8.3 | 8.2 |
| 32 | 83.5 | 0 | 0 | 16.5 |
| 33 | 85.0 | 0 | 15.0 | 0 |
| 34 | 85.0 | 0 | 7.5 | 7.5 |
| 35 | 85.0 | 0 | 0 | 15.0 |
| 36 | 85.0 | 4.0 | 5.0 | 6.0 |
| 37 | 85.0 | 7.0 | 8.0 | 0 |
| 38 | 85.0 | 7.0 | 4.0 | 4.0 |
| 39 | 85.0 | 7.0 | 0 | 8.0 |
| 40* | 85.0 | 11.0 | 2.0 | 2.0 |
| 41* | 85.0 | 13.0 | 1.0 | 1.0 |
| 42* | 87.0 | 1.0 | 6.0 | 6.0 |
| 43* | 87.0 | 7.0 | 3.0 | 3.0 |

Mark * is out of the scope of the invention

TABLE 2

| SAMPLE No. | DIELECTRIC CONSTANT $\epsilon$ | DIELECTRIC LOSS tan $\delta$ (%) | RESISTIVITY ($\Omega$ cm) | SHRINKAGE FACTOR (%) | REMARK |
|---|---|---|---|---|---|
| 1* | 1802 | 10.0 | $1.4 \times 10^8$ | 20.9 | |
| 2* | 2495 | 7.5 | $3.0 \times 10^8$ | 16.4 | |
| 3* | 3012 | 5.2 | $1.3 \times 10^9$ | 16.2 | |
| 4* | 2214 | 4.0 | $5.1 \times 10^8$ | 16.2 | |
| 5 | 2861 | 1.2 | $1.8 \times 10^{12}$ | 16.2 | |
| 6 | 2815 | 1.2 | $2.1 \times 10^{12}$ | 16.2 | |
| 7 | 2798 | 1.3 | $1.1 \times 10^{12}$ | 16.2 | |
| 8 | 3001 | 0.1 | $3.2 \times 10^{12}$ | 16.1 | |
| 9 | 2985 | 0.1 | $1.8 \times 10^{12}$ | 16.1 | |
| 10 | 3050 | 0.2 | $1.6 \times 10^{12}$ | 16.1 | |
| 11 | 3589 | 0.3 | $2.4 \times 10^{13}$ | 16.0 | |
| 12 | 3641 | 0.3 | $2.1 \times 10^{13}$ | 16.0 | |
| 13 | 3594 | 0.4 | $2.2 \times 10^{13}$ | 16.0 | |
| 14* | 4081 | 7.0 | $7.8 \times 10^8$ | 15.4 | |
| 15* | 1801 | 2.5 | $2.4 \times 10^9$ | 16.3 | |
| 16 | 3590 | 0.2 | $1.8 \times 10^{13}$ | 15.2 | |
| 17* | 1421 | 10.5 | $1.5 \times 10^7$ | 18.1 | |
| 18 | 1805 | 1.2 | $4.2 \times 10^{12}$ | 16.1 | |
| 19 | 3107 | 0.1 | $1.8 \times 10^{13}$ | 16.1 | |
| 20* | 805 | 11.8 | $1.3 \times 10^7$ | 20.1 | |
| 21 | 2070 | 0.3 | $2.5 \times 10^{12}$ | 15.7 | |
| 22 | 3502 | 1.5 | $2.5 \times 10^{11}$ | 15.2 | |
| 23* | — | — | — | 10.1 | NOT SINTERED |
| 24* | 941 | 8.8 | $3.6 \times 10^8$ | 16.5 | |
| 25* | 420 | 4.6 | $3.5 \times 10^9$ | 15.0 | |
| 26 | 756 | 1.7 | $6.5 \times 10^{11}$ | 16.2 | |
| 27 | 2011 | 0.8 | $2.1 \times 10^{13}$ | 16.5 | |
| 28 | 3017 | 0.3 | $1.4 \times 10^{13}$ | 15.2 | |
| 29* | — | — | — | 6.4 | NOT SINTERED |
| 30 | 1090 | 0.6 | $2.4 \times 10^{12}$ | 15.0 | |
| 31 | 981 | 0.6 | $2.6 \times 10^{12}$ | 15.0 | |
| 32 | 997 | 0.6 | $2.5 \times 10^{12}$ | 15.0 | |
| 33 | 933 | 1.3 | $5.9 \times 10^{12}$ | 16.2 | |
| 34 | 953 | 1.3 | $6.1 \times 10^{12}$ | 16.2 | |
| 35 | 920 | 1.3 | $6.0 \times 10^{12}$ | 16.2 | |
| 36 | 1633 | 1.4 | $5.9 \times 10^{12}$ | 14.4 | |
| 37 | 2097 | 1.1 | $2.8 \times 10^{12}$ | 15.3 | |
| 38 | 2090 | 0.9 | $3.1 \times 10^{12}$ | 15.3 | |
| 39 | 2088 | 1.0 | $2.7 \times 10^{12}$ | 15.3 | |
| 40* | 1577 | 4.6 | $3.5 \times 10^{12}$ | 10.0 | UNDERSINTERING |
| 41* | — | — | — | 6.2 | NOT SINTERED |
| 42* | 950 | 4.5 | $5.1 \times 10^8$ | 16.5 | |
| 43* | 1919 | 7.1 | $2.1 \times 10^8$ | 11.2 | UNDERSINTERING |

Mark * is out of the scope of the invention

What is claimed is:

1. An LC composite element which is formed by integrally molding and co-firing an inductance material and a capacitance material, wherein said capacitance material is a dielectric ceramic composition which is a solid solution having two components, $Pb(Ni_{\frac{1}{3}}Nb_{\frac{2}{3}})O_3$—$PbTiO_3$, and at least one additive component selected from the group consisting of $Pb(Zn_{\frac{1}{2}} W_{\frac{1}{2}})O_3$ and $Pb(Cu_{\frac{1}{3}} Nb_{\frac{2}{3}})O_3$, the mol percents of the components falling within the following ranges:

$Pb(Ni_{\frac{1}{3}} Nb_{\frac{2}{3}})O_3$: 75.0–85.0;
$PbTiO_3$: 8–12.0;

at least one of the $Pb(Zn_{\frac{1}{2}} W_{\frac{1}{2}})O_3$ and $Pb(Cu_{\frac{1}{3}} Nb_{\frac{2}{3}})O_3$ components: 5.0–16.5, the dielectric constant of said dielectric ceramic composition being within the range of 1000–4000, and the sintering temperature of said dielectric ceramic composition being not more than 1000° C.

2. An LC composite element according to claim 1, wherein said dielectric ceramic material further comprises at least one oxide selected from the group consisting of oxides of Mn, Mg and Ca in an amount not exceeding 0.5 mol percent.

3. An LC composite element according to claim 1, wherein said inductance material is a Ni—Zn—Cu ferrite material.

4. An LC composite element according to claim 1 wherein the additive component is $Pb(Cu_{\frac{1}{3}}Nb_{\frac{2}{3}})O_3$.

5. An LC composite element according to claim 1, wherein said dielectric ceramic composition further comprises at least one oxide selected from the group consisting of oxides of Mg and Ca in an amount not exceeding 0.5 mol percent.

6. A method of manufacturing an LC composite element comprising the steps of:

preparing a molded object by integrally molding an inductance material and a capacitance material, and firing said molded object at a temperature of not more than 1000° C., wherein said capacitance material is a dielectric ceramic composition which is a solid solution having two components, $Pb(Ni_{\frac{1}{3}} Nb_{\frac{2}{3}})O_3$—$PbTiO_3$, and at least one additive component selected from the group consisting of $Pb(Zn_{\frac{1}{2}} W_{\frac{1}{2}})O_3$ and $Pb(Cu_{\frac{1}{3}} N_{\frac{2}{3}})O_3$, the mol percents of the components falling within the following ranges:

$Pb(Ni_{\frac{1}{3}} Nb_{\frac{2}{3}})O_3$: 75.0–85.0;
$PbTiO_3$: 0–12.0;

at least one of the $Pb(Zn_{\frac{1}{2}} W_{\frac{1}{2}})O_3$ and $Pb(Cu_{\frac{1}{3}} Nb_{\frac{2}{3}})O_3$ components: 5.0–16.5 and dielectric constant of said dielectric ceramic composition within the range of 1000–4000.

7. A method of manufacturing an LC composite element according to claim 6, wherein said dielectric ceramic composition further comprises at least one oxide selected from the group consisting of oxides of Mn, Mg and Ca in an amount not exceeding 0.5 mol percent.

8. A method of manufacturing an LC composite element according to claim 6, wherein said inductance material is a Ni—Zn—Cu ferrite material.

9. A method of manufacturing an LC composite element according to claim 6 wherein the additive component is $Pb(Cu_{\frac{1}{3}}Nb_{\frac{2}{3}})O_3$.

10. A method of manufacturing an LC composite element according to claim 6, wherein said dielectric ceramic composition further comprises at least one oxide selected from the group consisting of oxides of Mg and Ca in an amount not exceeding 0.5 mol percent.

* * * * *